United States Patent
deVilliers et al.

(10) Patent No.: US 9,653,319 B2
(45) Date of Patent: May 16, 2017

(54) METHOD FOR USING POST-PROCESSING METHODS FOR ACCELERATING EUV LITHOGRAPHY

(71) Applicant: Tokyo Electron Limited, Minato-ku, Tokyo (JP)

(72) Inventors: Anton J. deVilliers, Clifton Park, NY (US); Kaushik Kumar, Clifton Park, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 52 days.

(21) Appl. No.: 14/532,859

(22) Filed: Nov. 4, 2014

(65) Prior Publication Data

US 2015/0132965 A1 May 14, 2015

Related U.S. Application Data

(60) Provisional application No. 61/902,223, filed on Nov. 9, 2013, provisional application No. 61/901,768, filed on Nov. 8, 2013.

(51) Int. Cl.
    | | |
    |---|---|
    | *G03F 7/26* | (2006.01) |
    | *H01L 21/311* | (2006.01) |
    | *H01L 21/027* | (2006.01) |
    | *H01L 21/033* | (2006.01) |

(52) U.S. Cl.
    CPC .......... *H01L 21/31144* (2013.01); *G03F 7/26* (2013.01); *G03F 7/265* (2013.01); *H01L 21/0272* (2013.01); *H01L 21/0273* (2013.01); *H01L 21/0274* (2013.01); *H01L 21/0332* (2013.01); *H01L 21/0337* (2013.01); *H01L 21/31111* (2013.01); *H01L 21/31116* (2013.01)

(58) Field of Classification Search
    CPC ....................................................... G03F 7/26
    See application file for complete search history.

(56) References Cited

U.S. PATENT DOCUMENTS

| 6,709,807 | B2 | 3/2004 | Hallock et al. |
| 7,659,050 | B2 | 2/2010 | Bucchignano et al. |
| 8,470,711 | B2 | 6/2013 | Arnold et al. |
| 2009/0111281 | A1* | 4/2009 | Bencher ............. H01L 21/0337 438/763 |
| 2009/0214959 | A1 | 8/2009 | Huang et al. |
| 2010/0130016 | A1 | 5/2010 | De Villiers |
| 2013/0129995 | A1 | 5/2013 | Ouattara et al. |
| 2013/0171571 | A1 | 7/2013 | Dunn et al. |
| 2014/0057436 | A1* | 2/2014 | Chen .................. H01L 21/0337 438/675 |
| 2015/0079393 | A1* | 3/2015 | Freedman ............ G03F 7/0042 428/402 |

FOREIGN PATENT DOCUMENTS

WO   WO2013/078211   5/2013

OTHER PUBLICATIONS

International Patent Application No. PCT/US2014/063924, "International Search Report," mailed Jan. 14, 2015, International filing date Nov. 4, 2014.

"International Preliminary Report on Patentability" dated May 10, 2016 issued in International Patent Application No. PCT/US2014/063924.

* cited by examiner

*Primary Examiner* — Kathleen Duda

(74) *Attorney, Agent, or Firm* — DLA Piper LLP US

(57) ABSTRACT

Methods for using high-speed EUV resists including resists having additives that may be detrimental to etch chambers. Methods include using reversal materials and/or reversal techniques, as well as diffusion-limited etch-back and slimming for pattern creation and transfer. A substrate with high-speed EUV resist is lithographically patterned and developed into a patterned resist mask. An image reversal material is then over-coated on the patterned resist mask such that the image reversal material fills and covers the patterned resist mask. An upper portion of the image reversal material is removed such that top surfaces of the patterned resist mask are exposed. The patterned resist mask is removed such that the image reversal material remains resulting in a patterned image reversal material mask. Residual resist material is removed via a slimming process using an acid diffusion and subsequent development.

15 Claims, 6 Drawing Sheets

METHOD FOR USING POST-PROCESSING METHODS FOR ACCELERATING EUV LITHOGRAPHY

CROSS REFERENCE TO RELATED APPLICATIONS

The present application claims the benefit of U.S. Provisional Patent Application No. 61/902,223, filed on Nov. 9, 2013, entitled "Method for Using Post-Processing Methods for Accelerating EUV Lithography," which is incorporated herein by reference in its entirety. The present application also claims the benefit of U.S. Provisional Patent Application No. 61/901,768, filed on Nov. 8, 2013, entitled "Method for Chemical Polishing and Planarization," which is incorporated herein by reference in its entirety.

BACKGROUND OF THE INVENTION

This invention relates to patterning thin films and various layers on a substrate. Such patterning includes patterning for fabricating semiconductor devices within a photolithographic patterning scheme.

In material processing methodologies (such as photolithography), creating patterned layers comprises the application of a thin layer of radiation-sensitive material, such as photoresist (resist), to an upper surface of a substrate. This radiation-sensitive material is transformed into a patterned mask that can be used to transfer a pattern into an underlying layer on a substrate such as by etching processes. Patterning of the radiation-sensitive material generally involves exposure by a radiation source through a reticle (and associated optics) onto the radiation-sensitive material using, for example, a photo-lithography system such as a scanner or stepper tool. This exposure can then be followed by the removal of irradiated regions of the radiation-sensitive material (as in the case of positive photoresist), or non-irradiated regions (as in the case of negative resist) using a developing solvent. This mask layer may comprise multiple sub-layers.

Extreme ultraviolet (EUV) photolithography is an emerging technology designed to use EUV radiation to pattern various resist films. This patterning can be part of microfabrication processes, such as those used to make integrated circuits. EUV radiation can include light spanning wavelengths from 124 nm down to around 10 nm, with EUV photolithography attempting to use wavelengths between 10-20 nm.

SUMMARY

Conventional extreme ultraviolet radiation (EUV) resist films tend to have relatively slow development times. For example, such resists can require 70 millijoules (mJ) or more of EUV exposure, which is a significant and costly challenge. Thus, high-speed EUV resists, that is resists with significantly shorter development times would be beneficial for EUV lithography. One particular high-speed resist has been developed. This high-speed resist uses hafnium nanoparticles to lessen exposure times or energies needed, but using this high-speed resist is problematic. For example, one problem is line edge roughness (LER). Another problem is that certain nanoparticles (including hafnium oxide) are detrimental inside etch chambers and it is desirable to avoid placing substrates with such materials inside plasma processing chambers. Thus, overcoming roughness problems and/or particles that are unfriendly to etch chambers can be useful for enabling high-speed EUV resists for use in microfabrication processes.

The semiconductor industry in general has a significant interest in making EUV lithography and EUV tools functional. The success of the semiconductor road map is contingent on success of the EUV tools. The speed of EUV development is in part connected to EUV dose.

High-speed resists have the ability of reducing EUV dosage by roughly a factor of ten. One example high-speed resist has been developed by Cornell University, Christopher Ober, "Current Status of Inorganic Nanoparticle Photoresists" Feb. 12, 2012, Ithaca, N.Y., and published on the International EUV initiative, http://ieuvi.org/TWG/Resist/2012/021212/8-Ober-SEMATECH_TWG_2012_final.pdf, the contents of which are herein incorporated by reference in their entirety. This particular resist uses hafnium nanoparticles to decrease a required EUV dosage prior to developing the resist. One challenge with this hafnium oxide nanoparticle resist is that currently there is no acceptable method of using it because of associated problems. One problem is that these particles are very detrimental inside etch chambers. It is strongly desired to keep these particles out of etch chambers. Another problem is that the fidelity of the line edge roughness does not meet desired specifications.

Thus, one EUV lithography challenge is using high-speed resists that may have additives or nanoparticles that are either detrimental or non-favorable for etch chambers. Other challenges with using high-speed resists are that they provide unacceptable roughness and resolution. Techniques herein include novel methods for using high-speed EUV resists that may be unfriendly to etch chambers. Techniques include using reversal materials and/or reversal techniques, as well as diffusion-limited etch-back and slimming techniques.

For example, embodiments herein include methods for patterning a substrate. Such methods can include receiving a substrate having a radiation-sensitive layer. The radiation-sensitive layer comprising a resist composition having material properties that provide lithographic resolution of less than about 40 nanometers when exposed to extreme ultraviolet radiation lithography. Next a patterned resist mask can be created on the substrate by developing a pattern transferred into the radiation-sensitive layer via an extreme ultraviolet lithography process. The extreme ultraviolet lithography process includes exposure of less than about 10 millijoules of extreme ultraviolet radiation per centimeter squared of the substrate. The extreme ultra violet radiation has wavelengths between about 10 nanometers to 124 nanometers. An image reversal material is then over-coated on the patterned resist mask such that the image reversal material fills and covers the patterned resist mask. An upper portion of the image reversal material is removed such that top surfaces of the patterned resist mask are exposed. The patterned resist mask is also removed such that the image reversal material remains resulting in a patterned image reversal material mask. The patterned image reversal material mask is then slimmed such that initial dimensions of the patterned image reversal material mask are reduced and residual resist material, embedded within exposed surfaces of the patterned image reversal material mask, is removed.

Other embodiments can include transferring a pattern defined by the patterned image reversal material mask into an underlying layer via a dry etching process resulting in a patterned underlying layer. The patterned image reversal material mask can then be removed to execute a sidewall image transfer process using the patterned underlying layer as a mandrel for the sidewall image transfer process.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include novel methods for using high-speed EUV resists having additives or materials that may be unfriendly to etch chambers. Techniques include using reversal materials and/or reversal techniques, as well as diffusion-limited etch-back and slimming techniques. Such techniques enable use of various high-speed resists. With techniques herein, by way of a non-limiting example, an EUV resist can be used to pattern an underlying anti-reflective coating (ARC) layer and layers beneath as well as implementing one or more a double patterning processes.

Figure 1:
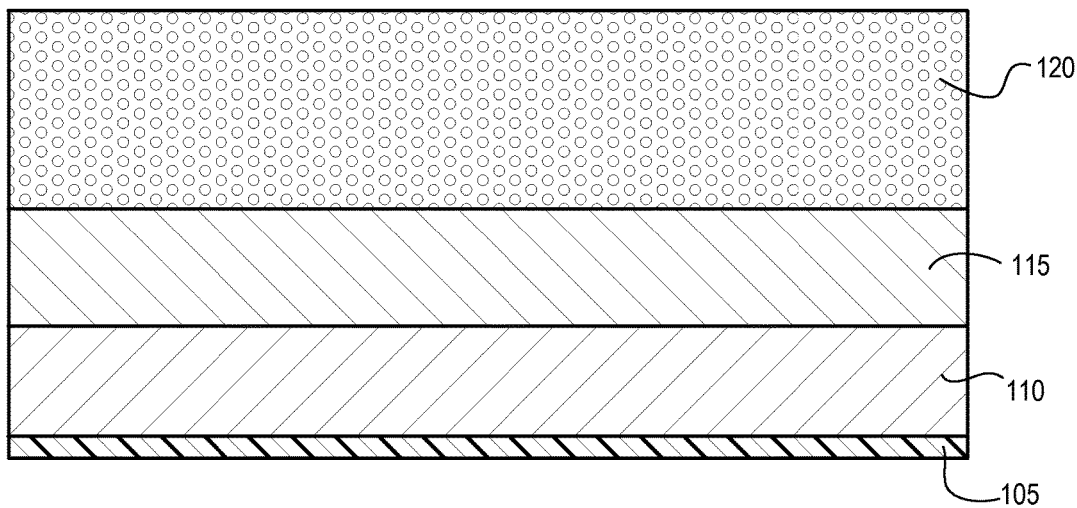
FIGS. 1-15 are schematic, cross-sectional views of a substrate segment showing a process sequence for patterning a substrate.

Embodiments include methods for patterning substrates. Referring now to FIG. 1, a cross-sectional schematic diagram shows an example substrate segment. A radiation-sensitive layer 120 is deposited on a substrate having one or more underlying levels. A coater/developer tool or track tool can be used for depositing the radiation-sensitive layer 120. Radiation-sensitive layer 120 can be a high-speed resist in that radiation-sensitive layer 120 can be fully developed after exposure to less than approximately 10 millijoules of extreme ultraviolet radiation per centimeter squared of a given substrate. Conventionally, lithographic light exposure dosages are given in terms of energy applied per centimeter squared. Thus, radiation-sensitive layer 120 can have development speeds that are 5-10 times faster than conventional photoresists. An example high-speed resist is a hafnium oxide-containing photo resist (a resist containing embedded or suspended nanoparticles). Radiation-sensitive layer 120 can be constructed/selected to provide a relatively quick developing speed, but added nanoparticles may or may not provide a product composition that is safe to etch in etch chambers. In other words, when etched, the radiation-sensitive layer 120 can release particles that are damaging to conventional semiconductor etch chambers. Another challenge with radiation-sensitive layer 120 is that radiation-sensitive layer 120 may not provide an acceptable line edge roughness (LER) in that a resulting degree of roughness is too rough as compared to a specified roughness for a given semiconductor product design.

Underlying radiation-sensitive layer 120 can be multiple layers of various materials and thicknesses. For convenience in explaining embodiments herein, examples will primarily focus on a three layer stack on a substrate 105. Positioned below the radiation-sensitive layer 120 is transfer layer 115, which in turn is positioned on mask layer 110 (a target layer), into which a pattern can be eventually transferred.

Using EUV photolithography imaging techniques, a pattern (photolithographic pattern) can be transferred into radiation-sensitive layer 120. When imaging is executed at, for example, a 32 nm set point, energy used for imaging can be on the order of 6.6 miliJoules per $cm^2$, resulting in a line width roughness (LWR) value of around 3.8 nanometers. Note that this is an example set point only. In another example, if a target of interest is to have 16 nm nodes (having a 16 nm specified critical dimension), then conventional EUV resists can require 30-60 mJ of radiation per $cm^2$. Thus, radiation-sensitive layer 120 can provide a significant increase in development speed.

Figure 2:
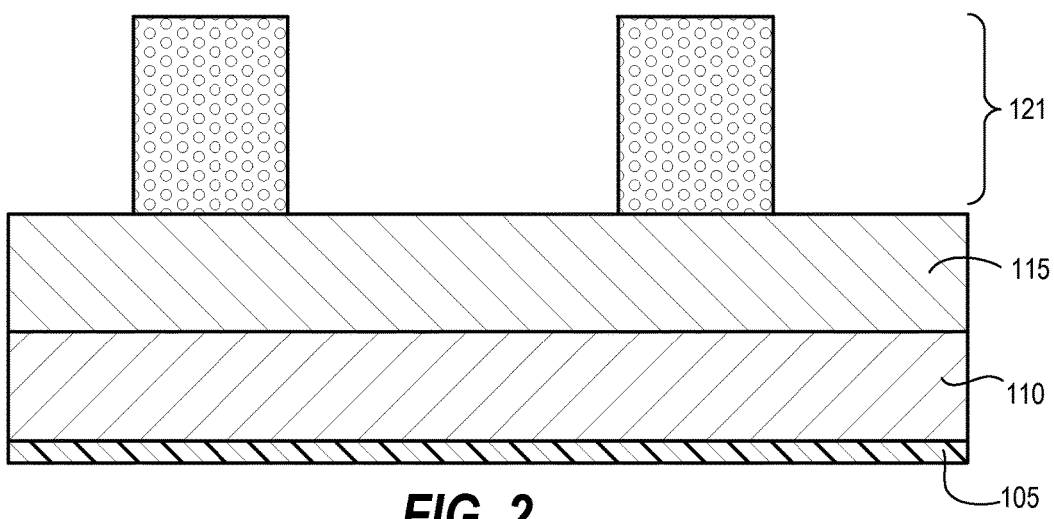

Radiation-sensitive layer 120 can be applied as a film. Such a film can be applied by conventional techniques such as spin coating in a coater/developer tool or track tool, and then baked and transferred to an EUV lithography tool. Then the substrate can return to a thermal processing system and receive a post-exposure bake, after which the exposed radiation-sensitive layer can be developed such that soluble portions are dissolved and removed (exposed or unexposed portions depending on whether the resist is positive or negative) yielding a patterned resist mask 121 developed from radiation-sensitive layer 120 as shown in FIG. 2. FIG. 2 shows patterned resist mask 121 as two plugs or lines in this example cross-sectional view.

One difference with radiation-sensitive layer 120, as compared to conventional resists and other EUV resists, is that radiation-sensitive layer 120 can include nanoparticles (such as hafnium oxide) and/or other ingredients. Solubility of these nanoparticles can be such that the nanoparticles have a diffusion characteristic or propensity for diffusion. These nanoparticles can be suspended in a photo resist, and then this photo resist can be conventionally dispensed, processed, exposed, and spin cast. Thus, radiation-sensitive layer 120 can be a film processed on conventional tools, albeit the high-speed resist itself is not conventionally used.

Figure 3:
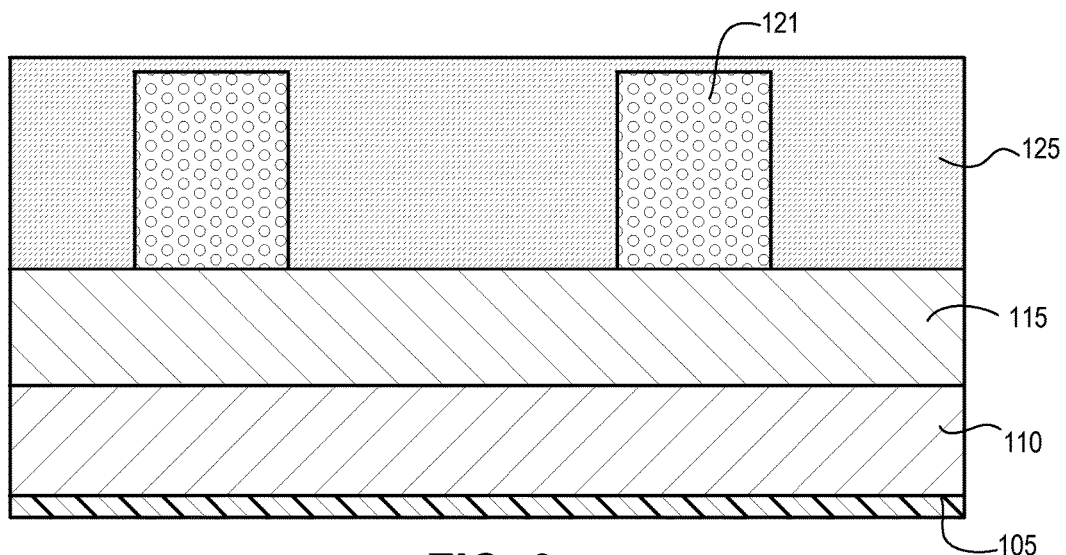

After developing a latent pattern to create patterned radiation-sensitive layer 121, it may not be desirable to etch an underlying layer in an etch chamber using radiation-sensitive layer 120 as a mask because the radiation-sensitive layer 120 may release particles that contaminate the etch chamber. To enable use of high-speed resists with detrimental or potentially detrimental particles, techniques herein include executing one or more reversal steps. For example, an image reversal over-coat can be applied to the substrate stack. Such a technique can be executed using a coater/developer tool. Referring to FIG. 3, an overcoat of image reversal material 125 is applied on patterned resist mask 121. The image reversal material 125 can have a potential for solubility change such that a top portion of the image reversal material 125 can have its solubility shifted or changed to become soluble. This overcoat processes can include an etch-back, or stop and fill then etch-back step. For some applications, there are advantages and disadvantages to selecting a develop-back that has some residual solubility, which can depend on whether a wet etch or a dry etch process is subsequently used. Any number of reversal agents can be used for image reversal material 125, such as polymers with a residual develop back capability. In alternative embodiments, oxide films can be used, followed by chemical-mechanical planarization (CMP), or an etch-back using a dry etch.

The image reversal material can be selected to have an inherent solubility potential and behave similarly to a conventional photoresist so that the image reversal material can be responsive to wet slimming. Alternative embodiments can use a material that does not behave like a resist, and in these embodiments an isotropic etch can be performed to slim and/or etch-back image reversal material to reveal the patterned resist mask. Thus, in response to selecting a reversal material that has a capability to shift its solubility through photo acid diffusion, wet slimming can be used. In response to using a reversal material that is not sensitive to photo acid (SiARC reversal or developable SiARC material), then a form of dry etching can be used, atomic layer etching or other etching technique with controllable etch depth.

Image reversal material 125 can overcoat, overfill, or otherwise partially cover some of patterned resist mask 121. Because of this an etch-back process can be used to reveal the patterned resist mask 121. With techniques herein, the substrate can remain in a coater/developer system for this etch-back process. In one embodiment, a diffusion-limited acid trim of the image reversal material 125 can be executed. A chemical trim overcoat is one example where applied acid diffuses from the top surface (where the acid or solubility-changing agent is applied) down into the film and changes a solubility of the film. Such a solubility change can correspond to a particular developer, solvent, or group of developers. After this change in solubility of a top portion of image reversal material 125, the substrate can again be processed by the coater/developer to dissolve and remove this top portion, which process can be considered a type of wet etch process. In embodiments using an etch chamber, an incomplete etch can be performed to avoid particles from the radiation-sensitive layer 121 being released within the etch chamber thereby contaminating the etch chamber. When performing the etch-back in a coater/developer system, a wet etch can be performed, such as with the top-down diffusion for solubility shifting.

Figure 4:
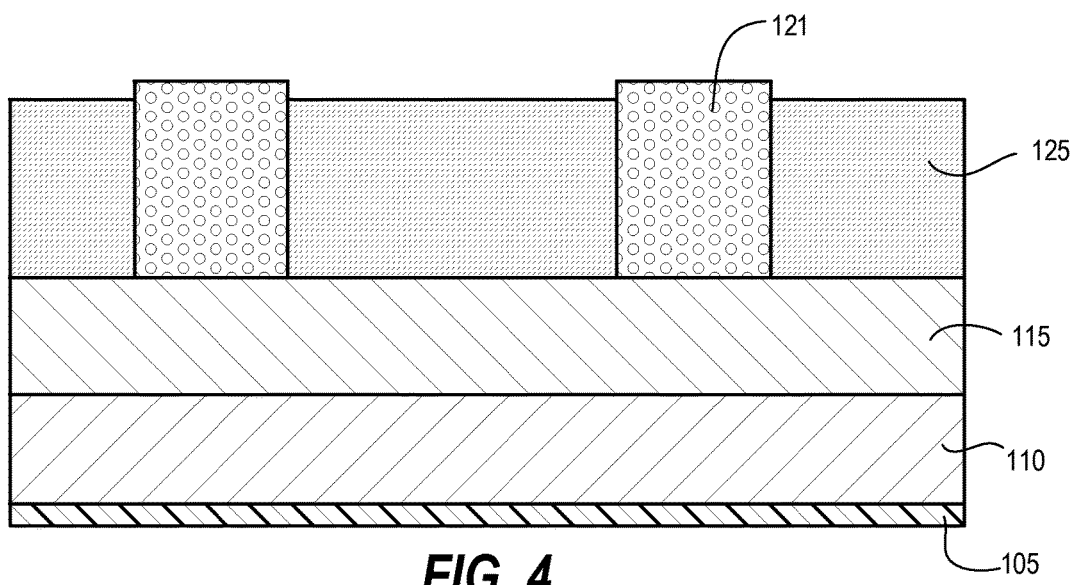

One technique as disclosed herein is to coat (or overcoat) the stack with acid for a top-down acid trim back. Top-down acid trim back comprises coating the substrate stack with an acid agent on the top. Then the stack is baked so that the acid diffuses downwardly into the film, that is, diffuses into a top portion of the image reversal material 125. The result is image reversal material 125 receiving a top-down solubility profile change. With the top portion of the image reversal material 125 now being soluble, the film can be washed and developed such that the top portion of the image reversal material 125 is removed. FIG. 4 shows an example result from a top-down acid trim back process. Note that patterned resist mask 121 can protrude above the image reversal material 125 to illustrate that material from the radiation-sensitive layer 120 is now exposed or revealed. Several parameters can be adjusted to control an amount or depth of the acid diffusion. For example, bake time, concentration of overcoat, molecular weight of the photo acid, bake temp, additional overcoat exposure to drive added acid, type of acid group, and so forth.

Figure 5:
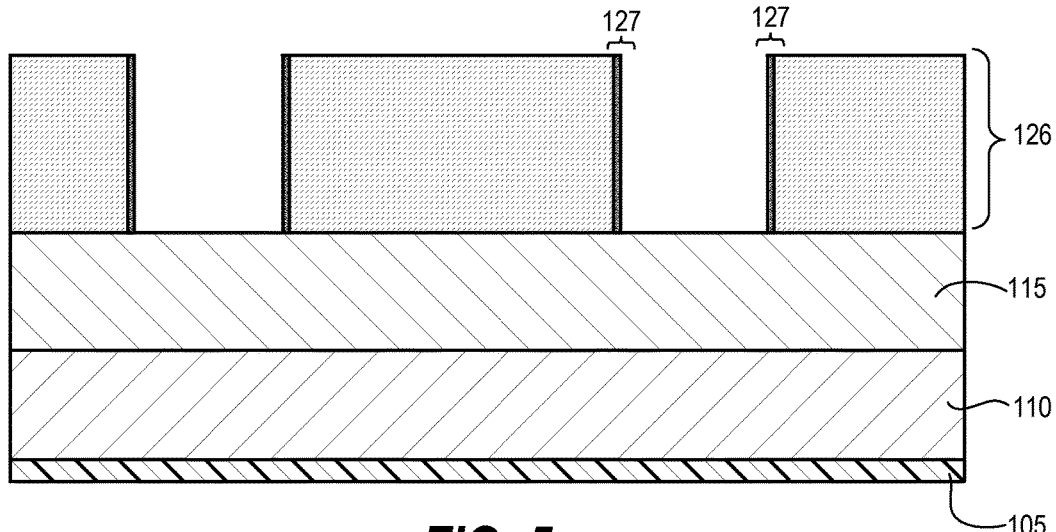

After the top-down trim back, the image reversal material 125 can be set or frozen with a bake. In other words, a thermal treatment can be used to remove an ability of the material to have further solubility shifts. Then the patterned resist mask 121 can be removed. FIG. 5 illustrates a resulting stack after such removal. With the radiation-sensitive layer removed, the result is a patterned image reversal material mask 126. Removing the high-speed resist is beneficial because it is desirable to remove harmful (or potentially harmful) nanoparticles from the substrate stack to prevent contamination in an etch chamber during subsequent processing. Note that not all of the nanoparticles may be removed/dissolved with the top-down trim back step because some of the nanoparticles will become embedded in surfaces of the image reversal material 125 defined by the patterned image reversal material mask 126. Some nanoparticles can have a diffusion aspect and move into adjacent material, or otherwise become entangled at interface areas. Area 127 shows where nanoparticles have become embedded within sidewalls of the patterned image reversal material mask 126, essentially where the reversal agent interfaced with the radiation-sensitive material.

A diffusion-limited slimming process can now be used to remove these residual nanoparticles. This can be a wet slimming process, which is beneficial especially when the nanoparticles are potential contaminants. In one embodiment, photo acid is again applied to the stack and baked down through the top surfaces and through the sidewalls of the patterned image reversal material mask 126. This step is executed to provide diffusion-limited slimming, that is, subsequent removal of material will be limited to a portion that the photo acid (or other agent) has made soluble or has changed solubility. Thus, after acid application and diffusion, the stack can be developed to remove this newly soluble portion. Note that any baking step after removal of patterned resist mask 121 may be withheld so that image reversal material maintains a solubility shifting potential for removing residual particles. A more detailed description of this wet slimming process can be found in U.S. Provisional Application Ser. No. 61/901,768, titled "Method for Chemical Polishing and Planarization" filed on Nov. 8, 2013.

Figure 6:
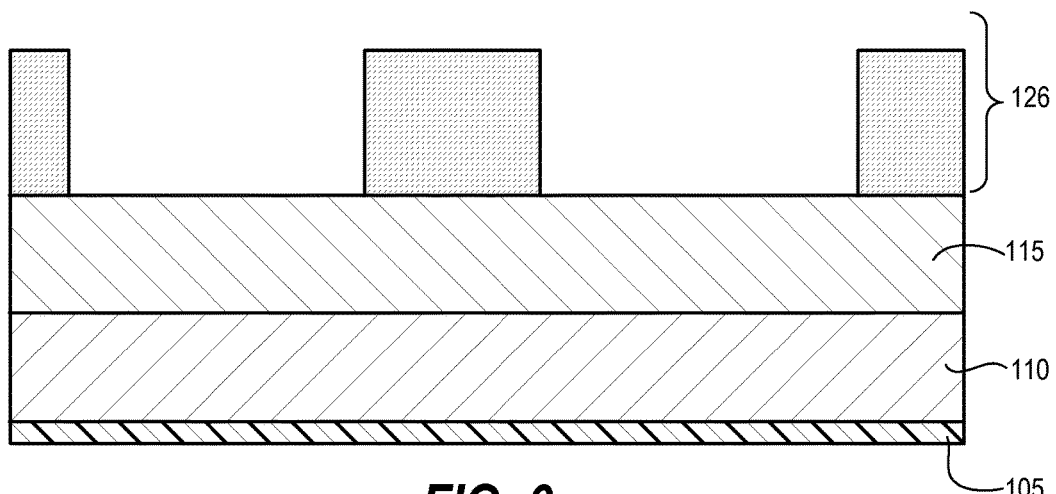

In FIG. 6, patterned image reversal material mask 126 is shown having features slimmed down as compared to FIG. 5. Such trim back can also provide smoothing to the patterned image reversal material mask 126, resulting in a LWR specified and having stripped away all harmful nanoparticles (such as Hf nanoparticles) that could cause contamination in a dry etch/plasma etch chamber. Thus, the diffusion-limited slim back, as disclosed herein, can have multiple applications, such as with etching through a reversal agent overcoat to reveal a high-speed resist pattern, as wells as to remove residual nanoparticles within the reversal agent. The diffusion-limited slim back can be used as an alternative to CMP, as well as a smoothing/slimming alternative. FIG. 6 thus shows a pattern that is smaller and with all contaminants removed with a LWR ready for subsequent pattern transfer. Note that some nanoparticles may not stop the concentration gradients of diffusion within photo materials, which is why these photo materials can still make an image and have developer developing through the nanoparticles as if they were not there, while still having photo acids changing protection groups embedded within a nanoparticle matrix.

Figure 7:
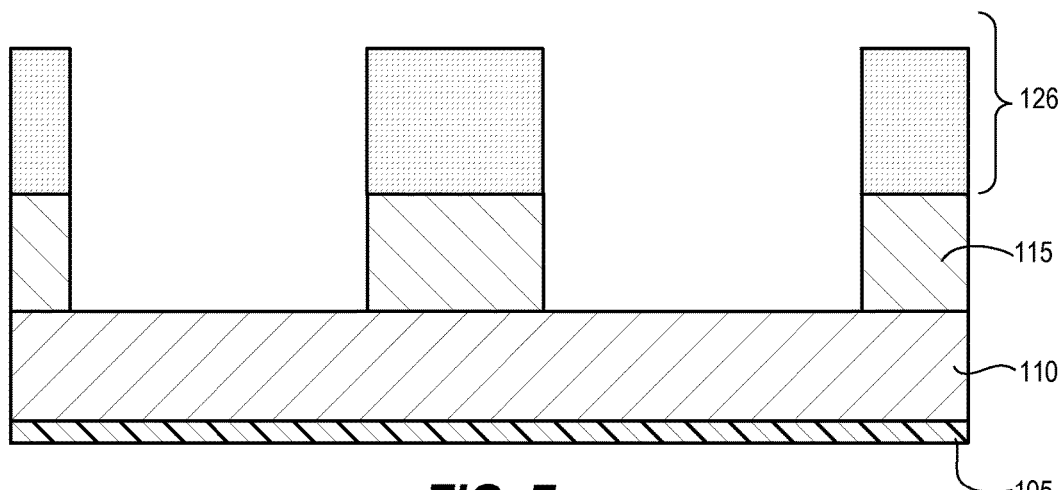

Referring now to FIG. 7, the patterned image reversal material mask 126 can be transferred into one or more underlying layers, such as the underlying transfer layer 115. At this point, the substrate stack can be etched within a plasma etch chamber without the danger of contamination from harmful particles. Another advantage is having acceptable line width roughness and/or line edge roughness in the pattern. With conventional EUV resists (resists that are not high-speed), by this stage there is often a LWR that is unacceptable for the 32 nanometer CD set point and below.

Figure 8:
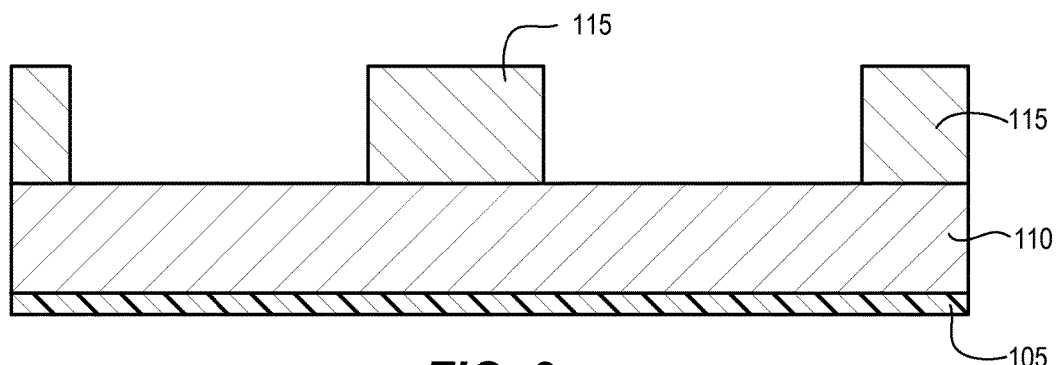

In FIG. 8, the image reversal material can be stripped, leaving a mandrel 115 to continue with additional fabrication steps, such as a sidewall image transfer (SIT) process. The first mandrel LWR is perhaps the most critical. If the mandrel is rough, then spacers could be created having one smooth side and one rough side. Techniques herein, however, can result in spacers with two smooth sides. Thus, the wet slimming/smoothing disclosed herein can be used to address imagery problems with EUV treatment. Conventionally, high-speed EUV resists have been avoided because of the LWR problems. Techniques herein, however, mitigate the LWR challenges through these process flows, and mitigate the resolution through SIT processing. One or more of these process steps enables EUV to be successful, otherwise high-speed resists and EUV lithography are typically not compatible with downstream processing.

Figure 9:
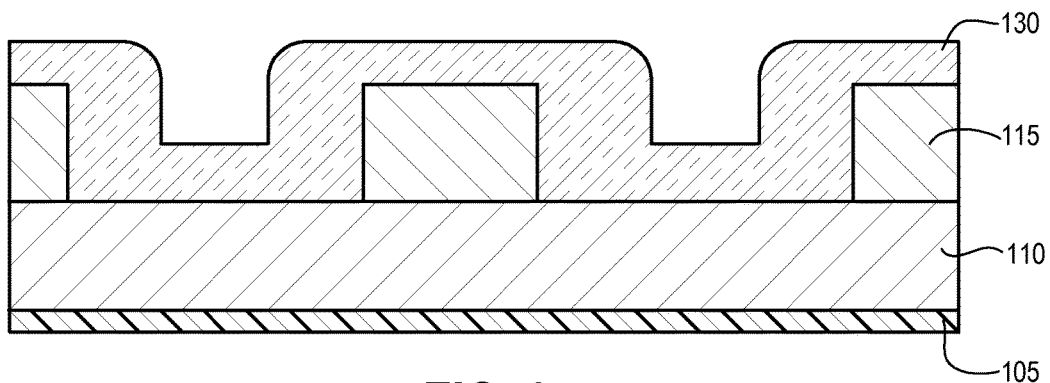
Figure 10:
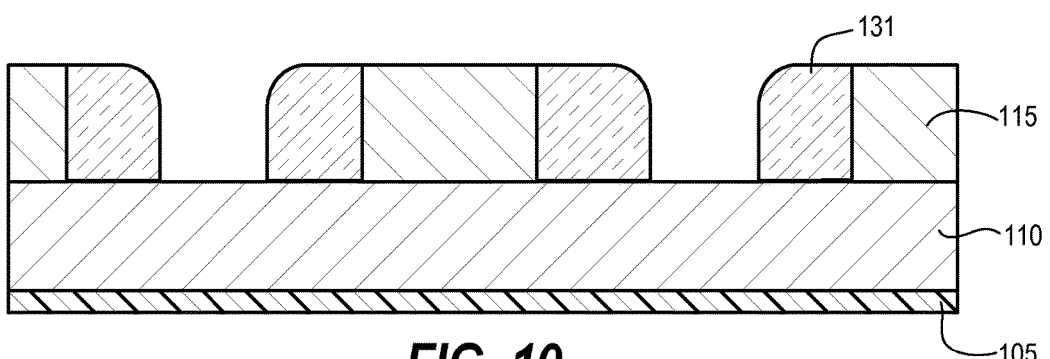
Figure 11:
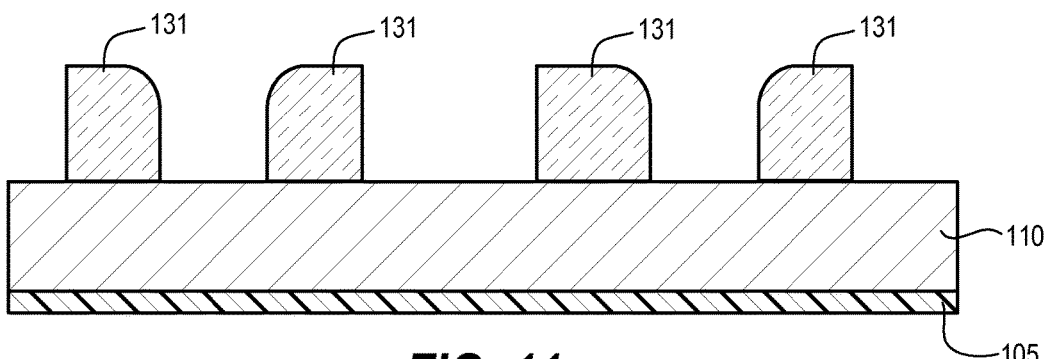
Figure 12:
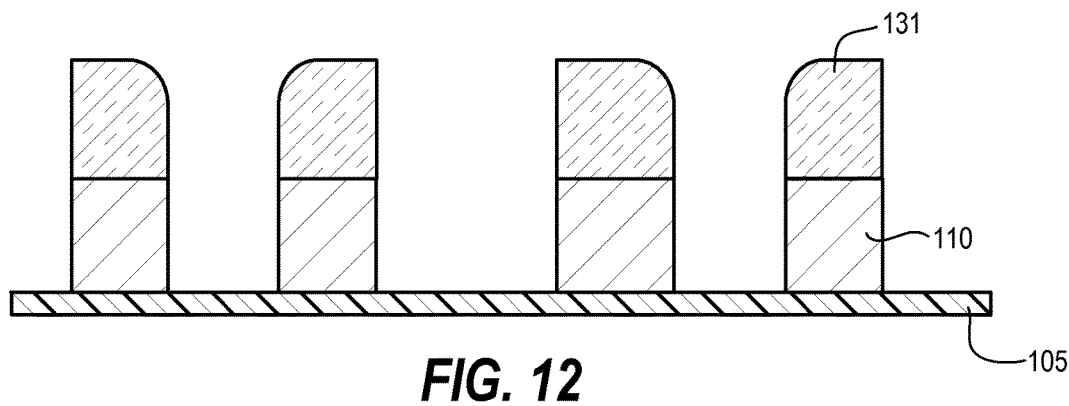
Figure 13:
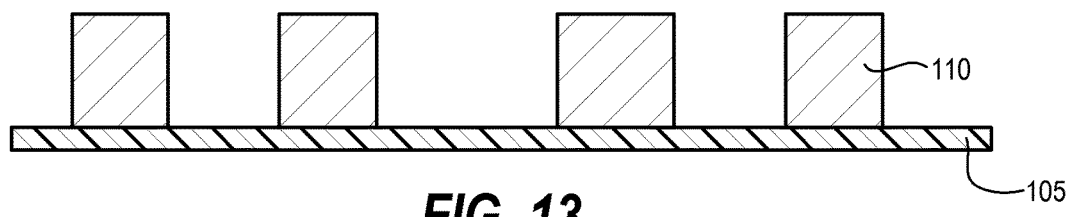
Figure 14:
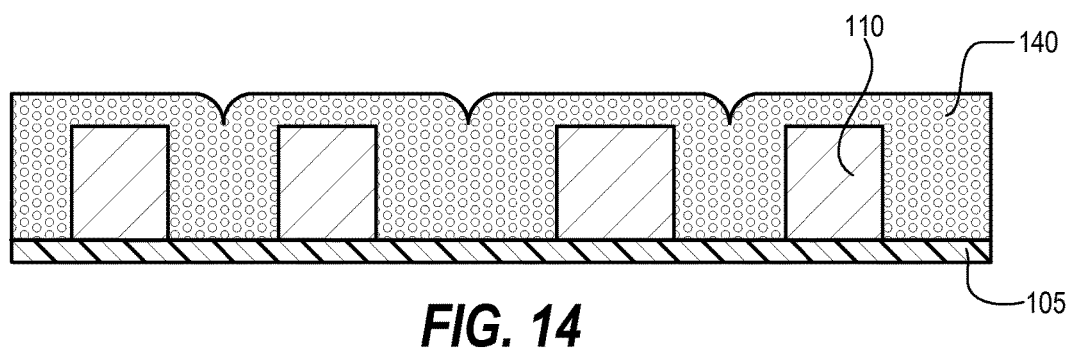
Figure 15:
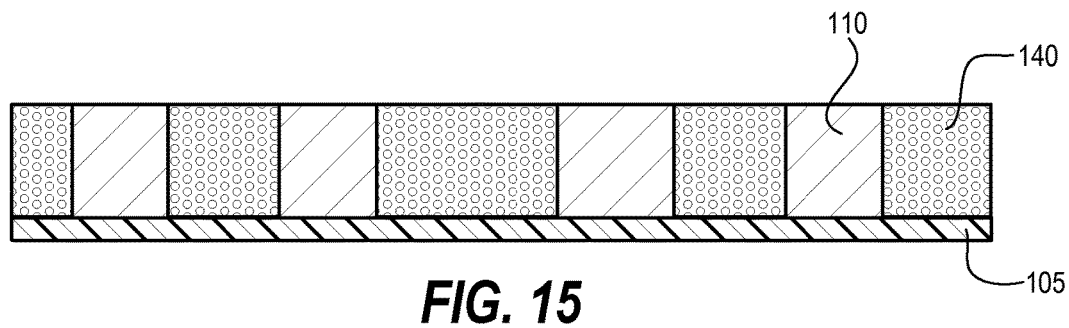

Continuing with the SIT processing and referring to FIG. 9, a conformal film 130 can be applied over mandrel 115, such as via atomic layer deposition to continue with a self-aligned double patterning (SADP) scheme. In FIG. 10, conformal film 130 is etched back to yield spacers 131. For example, an anisotropic etch is executed that clear material from on top of mandrels and on top of mask layer 110 expect at sidewall locations where material is sufficiently thick to avoid being etched away. In FIG. 11, mandrels 115 have been removed, leaving spacers 131. This essentially doubles the pattern from FIG. 8. In FIG. 12, this doubled pattern is transferred into mask layer 110. In FIG. 13, spacers can be removed, (such as by etching or ashing or wet cleaning), resulting in a mask or hard mask that is patterned having a desired resolution, smoothness, and critical dimension. Instead of a hardmask, permanent structures can result from this transfer. Any number of subsequent fabrication steps can be continued. For example, FIGS. 14 and 15 show that a plating damascene process can be executed, followed by CMP and cleaning, and/or other specified use of mask layer 110.

These several techniques help enable use of EUV resists for semiconductor fabrication. Currently, high-speed resists are not being used for commercial fabrication because of poor LWR, poor resolution, and/or contaminant content. Processes herein, however, enable use of EUV lithography and high-speed resists. These process address LWR by using a slimming agent and reversal flow together. This removes a need for plasma/dry etching of the high-speed resist but while removing any harmful nanoparticles. In other words, LWR issues are addressed as well as etch selectivity/contamination concerns. In addition to the diffusion-limited etch-back and reversal flow processes, sidewall image transfer (SIT) processes can be added to address resolution concerns and meet CD specifications. In some embodiments, a reversal flow can be coupled with diffusion-limited etch-back, especially when using a harmful high-speed resist. Certain harmful high-speed resists can provide sufficient resolution after image reversal and residual material removal. SIT schemes can also be added as a sub process when resolution is not sufficient. In other embodiments, the reversal flow can be coupled with a SIT process (excluding the slimming/etch-back step), especially when the high-speed resist provides acceptable LWR, but still needs higher resolution. In other embodiments, especially when using a high-speed resist that does not contain harmful particles, the reversal flow can be skipped. In such embodiments, after EUV image transfer and development a process flow can include diffusion-limited etch-back to address roughness, and then SIT to fix resolution.

Embodiments herein include additional methods for patterning a substrate. An additional method can comprise multiple steps. A substrate is received or provided having radiation-sensitive layer. This radiation-sensitive layer can also be applied to the substrate as part of the method. The radiation-sensitive layer comprises a resist composition having material properties that provide lithographic resolution of less than about 40 nanometers when exposed to extreme ultraviolet radiation lithography. A patterned resist mask is created on the substrate by developing a pattern transferred into the radiation-sensitive layer via an extreme ultraviolet lithography process. The extreme ultraviolet lithography process can include exposure to less than about 10 millijoules of extreme ultraviolet radiation per centimeter squared of the substrate. The extreme ultra violet radiation has wavelengths between about 10 nanometers to 124 nanometers, and preferably between about 10-20 nanometers. With this amount of energy, the radiation-sensitive layer can be fully developed. In other words, a high-speed resist is used. A high-speed resist, as used herein, refers to a resist that can be fully developed with less than about 10 mJ of EUV radiation, provide a resolution of less than about 40 nanometers, and roughness less than three nanometers (or a standard deviation of 3 nm for the roughness of line or width). The patterned resist mask is over-coated with an image reversal material such that the image reversal material fills and at least partially covers the patterned resist mask. Typically the image reversal material is spun on or otherwise deposited, and during this process the patterned resist mask is essentially covered. Covering the patterned resist mask is typical, but not required. Reversal material can fill between sidewalls of the patterned resist mask without actually covering a top of the patterned resist mask, but such a filling technique is typically difficult. Next, an upper portion of the image reversal material can be removed such that top surfaces of the patterned resist mask are exposed (revealed or uncovered). The patterned resist mask is then removed such that (in a way that) the image reversal material remains, resulting in a patterned image reversal material mask. In other words, the patterned defined by the image reversal material has been reversed using a second material. The patterned image reversal material mask can then be slimmed such that initial dimensions of the patterned image reversal material mask are reduced and residual resist material, embedded within exposed surfaces of the patterned image reversal material mask, is removed.

The radiation-sensitive layer (high-speed resist), can include additives that enable modifying solubility of the radiation-sensitive layer with less than about 10 millijoules of extreme ultraviolet radiation per centimeter squared of substrate surface area. For example, the additives can include a suspension of nanoparticles such as hafnium oxide, zirconium oxide, etc. The patterned resist mask can be characterized by an edge roughness of less than about 4 nanometers with a standard deviation of about 3 nanometers or less. The resist mask can also be characterized by a critical dimension (CD) of less than about 40 nanometers.

Removing the upper portion of the image reversal material can include using a wet etching process. The wet etching process can include coating the image reversal material with an acid, then baking the acid so that the acid diffuses into the upper portion of the image reversal material and changes a solubility of the upper portion of the image reversal material, and then developing the image reversal material such that the upper portion of the image reversal material is removed. The acid diffusion can be limited to a predetermined thickness, which can be control by various factors, such as by amount of acid, type of acid, bake time, pressure, etc. In alternative embodiments, etching the upper portion of the image reversal material includes using a dry etch process.

Slimming the patterned image reversal material mask can include using a wet etching process. For example, the patterned image reversal material mask is coated with an acid. The coated substrate is then baked such that the acid diffuses into exposed surfaces of the patterned image reversal material mask and changes a solubility of the exposed surfaces of the patterned image reversal material mask. The patterned image reversal material mask is developed such that the exposed surfaces of the patterned image reversal material mask are removed to a depth sufficient to remove residual resist material embedded with the exposed surfaces of the patterned image reversal material mask. Note that this process can be repeated one or more times to ensure that all contaminants have been removed.

In additional embodiments, a pattern defined by the patterned image reversal material mask is transferred into an underlying layer via a dry etching process resulting in a patterned underlying layer. The patterned image reversal material mask is removed, and then a sidewall image transfer process can be executed using the patterned underlying layer as a mandrel for the sidewall image transfer process. This is beneficial when a particular high-speed resist and EUV lithography process cannot meet a specified resolution. The sidewall image transfer process includes applying a conformal film to the patterned underlying layer. The conformal film is then partially etched such that a double pattern of the patterned underlying layer is created with the conformal film. The patterned underlying layer is removed, and then the double pattern is transferred to a mask layer underlying the conformal film.

Note that there are several alternative embodiments that can include or exclude various steps based on a type of high-speed resist used. In another embodiment a method for patterning a substrate includes receiving a substrate having a radiation-sensitive layer. The radiation-sensitive layer comprises a resist composition having material properties that provide lithographic resolution of less than about 40 nanometers when exposed to extreme ultraviolet radiation lithography. A patterned resist mask is created on the substrate by developing a pattern transferred into the radiation-sensitive layer via an extreme ultraviolet lithography process. The extreme ultraviolet lithography process includes exposure to less than about 10 millijoules of extreme ultraviolet radiation per centimeter squared of the substrate, the extreme ultra violet radiation having wavelengths between about 10 nanometers to 124 nanometers. The resist mask is over-coated with an image reversal material such that the image reversal material fills and covers the patterned resist mask. An upper portion of the image reversal material is removed such that top surfaces of the patterned resist mask are exposed or uncovered. The patterned resist mask is removed such that the image reversal material remains resulting in a patterned image reversal material mask. A sidewall image transfer process is executed using the patterned image reversal material mask as a mandrel for the sidewall image transfer process. Optionally, prior to executing the sidewall image transfer process, the patterned image reversal material mask can be slimmed such that initial dimensions of the patterned image reversal material mask are reduced and residual resist material, embedded within exposed surfaces of the patterned image reversal material mask, is removed. This can include diffusing an acid into the exposed surfaces of the patterned image reversal material mask such that the diffused acid changes a solubility of the exposed surfaces of the patterned image reversal material mask.

In another patterning embodiment, the reversal step is skipped, and a patterned resist mask is slimmed using a wet etch process. The wet etch process can include diffusing an acid into exposed surfaces of the patterned resist mask such that the diffused acid changes a solubility of the exposed surfaces of the patterned resist mask. This slimming improves an edge roughness of the patterned resist mask as compared to an initial edge roughness of the exposed surfaces of the patterned resist mask. A sidewall image transfer process can then be executed using the patterned resist mask as a mandrel for the sidewall image transfer process, the sidewall image transfer process transferring a doubled pattern of the patterned resist mask into an underlying layer via a dry etching process.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
receiving a substrate having a radiation-sensitive layer, the radiation-sensitive layer comprising a resist composition having material properties that provide lithographic resolution of less than 40 nanometers when exposed to extreme ultraviolet radiation lithography;
creating a patterned resist mask on the substrate by developing a pattern transferred into the radiation-sensitive layer via an extreme ultraviolet lithography process, the extreme ultraviolet lithography process includes exposure of less than 10 millijoules of extreme ultraviolet radiation per centimeter squared of the substrate, the extreme ultra violet radiation having wavelengths between 10 nanometers to 124 nanometers;
over-coating the patterned resist mask with an image reversal material such that the image reversal material fills and covers the patterned resist mask;
removing an upper portion of the image reversal material such that top surfaces of the patterned resist mask are exposed;
removing the patterned resist mask such that the image reversal material remains resulting in a patterned image reversal material mask; and
slimming a sidewall of the patterned image reversal material mask such that initial dimensions of the patterned image reversal material mask are reduced while a pattern shape of the patterned image reversal material mask is retained and residual resist material, embedded within exposed surfaces of the patterned image reversal material mask, is removed.

2. The method of claim 1, wherein the radiation-sensitive layer includes additives that enable modifying solubility of the radiation-sensitive layer with less than 10 millijoules of extreme ultraviolet radiation per centimeter squared of substrate surface area.

3. The method of claim 2, wherein the additives include a suspension of nanoparticles selected from the group consisting of hafnium oxide and zirconium oxide.

4. The method of claim 1, wherein the patterned resist mask is characterized by an edge roughness value of less than 4 nanometers with a standard deviation of 3 nanometers or less, and wherein the resist mask is characterized by a critical dimension (CD) of less than 40 nanometers.

5. The method of claim 1, wherein removing the upper portion of the image reversal material includes using a wet etching process.

6. The method of claim 5, wherein using the wet etching process includes:
coating the image reversal material with an acid;
baking the acid such that the acid diffuses into the upper portion of the image reversal material and changes a solubility of the upper portion of the image reversal material; and
developing the image reversal material such that the upper portion of the image reversal material is removed.

7. The method of claim 1, wherein etching the upper portion of the image reversal material includes using a dry etch process.

8. The method of claim 1, wherein slimming the patterned image reversal material mask includes using a wet etching process.

9. The method of claim 8, wherein using the wet etching process includes:

coating the patterned image reversal material mask with an acid;
baking the acid such that the acid diffuses into exposed surfaces of the patterned image reversal material mask and changes a solubility of the exposed surfaces of the patterned image reversal material mask; and
developing the patterned image reversal material mask such that the exposed surfaces of the patterned image reversal material mask are removed to a depth sufficient to remove residual resist material embedded with the exposed surfaces of the patterned image reversal material mask.

10. The method of claim 1, further comprising:
transferring a pattern defined by the patterned image reversal material mask into an underlying layer via a dry etching process resulting in a patterned underlying layer; removing the patterned image reversal material mask; and
executing a sidewall image transfer process using the patterned underlying layer as a mandrel for the sidewall image transfer process.

11. The method of claim 10, wherein executing the sidewall image transfer process includes:
applying a conformal film to the patterned underlying layer;
partially etching the conformal film such that a double pattern of the patterned
underlying layer is created with the conformal film;
removing the patterned underlying layer; and
transferring the double pattern to a mask layer underlying the conformal film.

12. A method for patterning a substrate, the method comprising:
receiving a substrate having a radiation-sensitive layer, the radiation-sensitive layer comprising a resist composition having material properties that provide lithographic resolution of less than 40 nanometers when exposed to extreme ultraviolet radiation lithography, the radiation-sensitive layer including additives that enable modifying solubility of the radiation-sensitive layer with less than 10 millijoules of extreme ultraviolet radiation per centimeter squared of substrate surface area, wherein the additives include a suspension of nanoparticles selected from a group consisting of hafnium oxide and zirconium oxide;
creating a patterned resist mask on the substrate by developing a pattern transferred into the radiation-sensitive layer via an extreme ultraviolet lithography process, the extreme ultraviolet lithography process includes exposure of less than 10 millijoules of extreme ultraviolet radiation per centimeter squared of the substrate, the extreme ultra violet radiation having wavelengths between 10 nanometers to 124 nanometers;
over-coating the patterned resist mask with an image reversal material such that the image reversal material fills and covers the patterned resist mask;
removing an upper portion of the image reversal material such that top surfaces of the patterned resist mask are exposed; and
removing the patterned resist mask such that the image reversal material remains resulting in a patterned image reversal material mask.

13. The method of claim 12, wherein the patterned resist mask is characterized by an edge roughness value of less than 4 nanometers with a standard deviation of less than 3 nanometers, and wherein the patterned resist mask is characterized by a critical dimension (CD) of less than 40 nanometers.

14. The method of claim 12, wherein removing the upper portion of the image reversal material includes using a wet etching process, the wet etching process including diffusing an acid into the upper portion of the image reversal material, the acid changing a solubility of the upper portion of the image reversal material.

15. The method of claim 12, further comprising:
  executing a sidewall image transfer process using the patterned image reversal material mask as a mandrel for the sidewall image transfer process; and
  prior to executing the sidewall image transfer process, slimming the patterned image reversal material mask such that initial dimensions of the patterned image reversal material mask are reduced and residual resist material, embedded within exposed surfaces of the patterned image reversal material mask, is removed, wherein slimming the patterned image reversal material mask includes diffusing an acid into the exposed surfaces of the patterned image reversal material mask such that the diffused acid changes a solubility of the exposed surfaces of the patterned image reversal material mask.

* * * * *